United States Patent [19]

Ameen et al.

[11] Patent Number: 5,762,778

[45] Date of Patent: Jun. 9, 1998

[54] NON-CYANIDE BRASS PLATING BATH AND A METHOD OF MAKING METALLIC FOIL HAVING A BRASS LAYER USING THE NON-CYANIDE BRASS PLATING BATH

[75] Inventors: Thomas J. Ameen; Gregory L. Orloff, both of Mentor, Ohio

[73] Assignee: Gould Electronics Inc., Eastlake, Ohio

[21] Appl. No.: 866,400

[22] Filed: May 30, 1997

Related U.S. Application Data

[63] Continuation of Ser. No. 600,243, Feb. 12, 1996, abandoned.

[51] Int. Cl.$^6$ .............................. C25D 3/58; C25D 3/56; B05B 3/10; B22F 7/00
[52] U.S. Cl. .................... 205/240; 205/155; 205/244; 106/1.18; 106/1.23; 106/1.26; 106/1.29
[58] Field of Search ........................ 205/77, 141, 155, 205/240, 244; 106/1.18, 1.23, 1.26, 1.29

[56] References Cited

U.S. PATENT DOCUMENTS

| | | | |
|---|---|---|---|
| 3,585,010 | 6/1971 | Luce et al. | 29/191.2 |
| 3,857,681 | 12/1974 | Yates et al. | 29/195 |
| 4,010,005 | 3/1977 | Morisaki et al. | 29/195 |
| 4,049,481 | 9/1977 | Morisaki | 156/151 |
| 4,376,154 | 3/1983 | Nakatsugawa | 428/607 |
| 4,456,508 | 6/1984 | Torday et al. | 204/27 |
| 4,469,567 | 9/1984 | Torday et al. | 204/27 |
| 5,243,320 | 9/1993 | Clouser et al. | 338/308 |

FOREIGN PATENT DOCUMENTS

| | | |
|---|---|---|
| 0269208 | 6/1988 | European Pat. Off. |
| 495468A2 | 7/1992 | European Pat. Off. ......... C25D 3/58 |
| 282879 | 9/1970 | U.S.S.R. |
| 379678 | 4/1973 | U.S.S.R. |
| 1020459 | 5/1983 | U.S.S.R. |

OTHER PUBLICATIONS

European Search Report mailed Jun. 24, 1997.

Abstract No. 127871X from Gerasimov, "Cyanide–free Brass Electroplating Prior To Rubberizing", Chemical Abstracts, vol. 80, No. 16, pp. 51–54 (Apr. 20, 1987).

Abstract No. 62272 from "Electrodeposition Of A Copper Zinc Alloy", Chemical Abstracts, vol. 72, No. 12 (Mar. 23, 1970).

Abstract No. 12947V from Derwent Publications Ltd., Week 7407 (Aug. 21, 1973).

Primary Examiner—Kathryn L. Gorgos
Assistant Examiner—Edna Wong
Attorney, Agent, or Firm—Michael A. Centanni

[57] ABSTRACT

The present invention provides a non-cyanide brass plating bath composition containing copper, zinc, metal polyphosphate, and orthophosphate, with the proviso that the composition does not contain cyanide. The present invention also provides a method of making metallic foil having a brass layer including the steps of providing a metallic foil; contacting the metallic foil with a non-cyanide brass plating bath containing copper, zinc, metal polyphosphate, and orthophosphate, with the proviso that the brass plating bath does not contain cyanide; applying a current to the brass plating bath; and recovering the metallic foil having a brass layer.

14 Claims, No Drawings

NON-CYANIDE BRASS PLATING BATH AND A METHOD OF MAKING METALLIC FOIL HAVING A BRASS LAYER USING THE NON-CYANIDE BRASS PLATING BATH

This is a continuation of application Ser. No. 08/600,243 filed on Feb. 12, 1996 now abandoned.

FIELD OF THE INVENTION

The present invention relates to a non-cyanide brass plating bath and a method of making a metallic foil having a brass layer using the non-cyanide brass plating bath. The invention more particularly relates to a non-cyanide brass plating bath and a method of applying a brass barrier layer to copper foil using the non-cyanide brass plating bath.

BACKGROUND OF THE INVENTION

Conductive metallic foils used in the printed circuit board industry may be treated in order to improve various properties thereof; namely, to increase surface area, to prevent oxidation and/or to increase peel strength. Electrochemical surface treatment of metallic foil can yield improved metal composites for use as conducting elements in printed circuits. For example, the addition of a barrier layer to a metallic foil prevents peel strength from decreasing with temperature. In the case where a barrier layer is applied to copper foil, the barrier layer prevents copper from interacting with a dielectric to which it may be subsequently laminated. The barrier layer may be made of a number of different metals including brass.

Conventionally, a stable brass plating bath used to manufacture metallic foil having a brass layer has been a cyanide brass plating bath. See, for example, U.S. Pat. No. 3,585,010 which describes the production of copper foil having a brass barrier layer thereon. A cyanide brass bath provides a desirable bright yellow brass deposit. The cyanide brass bath is also very stable and provides uniform brass deposits. However, cyanide is highly toxic and the destruction of cyanide, which may be conventionally accomplished by alkaline chlorination, is difficult and requires many controls thus complicating the brass plating bath treatment process. Because of the inherently dangerous nature of cyanide, the use of cyanide brass plating baths raises serious safety and environmental concerns. It is therefore desired to provide a brass plating bath which does not raise serious safety and environmental concerns.

Several non-cyanide brass plating baths have been proposed.

Although some brass plating baths contain lower levels of cyanide, the lower levels do not dispel the safety and environmental concerns. At this time, commercially available non-cyanide brass plating baths tend to produce either very thin self-limiting deposits or a discolored brass layer (for example, brass deposits from non-cyanide brass plating baths typically have brown, green or gray tints or staining). Brass deposits from commercially available non-cyanide brass plating baths must be subjected to a time consuming buffing treatment in order to produce a bright yellow brass luster. Accordingly, the most practical and efficient method to electroplate brass continues to include the use of a cyanide brass plating bath.

In light of the circumstances described above, it is desirable to provide non-cyanide brass plating bath capable of providing brass deposits on a metallic foil comparable in performance to brass deposits from cyanide brass plating baths. In other words, it is desirable to provide both a cyanide free brass plating bath and a brass plating bath which is easily disposed of using conventional waste treatment methods.

SUMMARY OF THE INVENTION

In one embodiment, the present invention provides an aqueous, non-cyanide brass plating bath composition containing copper, zinc, metal polyphosphate, and orthophosphate, with the proviso that the composition does not contain cyanide. In another embodiment, the present invention provides a method of making metallic foil having a brass layer including the steps of providing a metallic foil; contacting the metallic foil with a non-cyanide brass plating bath containing copper, zinc, metal polyphosphate, and orthophosphate, with the proviso that the brass plating bath does not contain cyanide; applying a current to the brass plating bath; and recovering the metallic foil having a brass layer. In another embodiment, the present invention provides a method of using a non-cyanide brass plating bath including contacting a metallic foil with the non-cyanide brass plating bath, wherein the non-cyanide brass plating bath comprises copper, zinc, metal polyphosphate, orthophosphate, and with the proviso that the brass plating bath does not contain cyanide.

As a result of the present invention, a non-cyanide brass plating bath capable of plating brass on a metallic foil with comparable quality to a cyanide brass plating bath is provided. More specifically, the present invention provides a non-cyanide brass plating bath which provides uniform brass deposits having bright yellow luster over a relatively wide range of conditions. Since cyanide is not present in the brass plating bath, not only is the bath markedly safer to use, but also serious environmental concerns are not raised. Moreover, it is not necessary to subject the metallic foil having a brass layer to a time consuming buffing treatment.

DETAILED DESCRIPTION

In one embodiment, the present invention provides a brass plating bath for the electrolytic deposition of a brass layer. Electrolytic deposition involves the use of an electroplating system including an electroforming cell containing a suitable anode and cathode submerged in an electrolytic solution or plating bath containing metal ions. An electrical current is applied between the anode and cathode. As a result, metal ions in the plating bath plate out on the cathode.

The non-cyanide brass plating bath composition according to the present invention is characterized in that it does not contain cyanide. In this context, cyanide includes cyanide ions and compounds containing cyanide such as cyanide salts, cyanide acids and organic cyanides. Specific examples include sodium cyanide, potassium cyanide, hydrogen cyanide, organic cyanides and the like.

The non-cyanide brass plating bath composition contains copper. Copper is generally present in an ionic state ($Cu^{2+}$). The amount of copper in the composition is from about 0.03 to about 0.15M, and preferably about 0.1 to about 0.15M. The copper is obtained by adding a suitable copper source, such as a copper containing compound, to the non-cyanide brass plating bath composition. The source of copper may be copper or an ionizable salt of copper. For example, copper may be obtained from a copper salt such as copper sulfate, copper polyphosphate, copper sulfamate or hydrates thereof. Copper sulfate and copper pyrophosphate are preferred.

The non-cyanide brass plating bath composition contains zinc. Zinc is generally present in an ionic state ($Zn^{2+}$). The amount of zinc in the composition is from about 0.03 to about 0.09M, and preferably about 0.05 to about 0.09M. The zinc is obtained by adding a suitable zinc source, such as a zinc containing compound, to the non-cyanide brass plating bath composition. The source of zinc may be zinc or an ionizable salt of zinc. For example, zinc may be obtained from a zinc salt such as zinc sulfate, zinc polyphosphate, zinc sulfamate or hydrates thereof. Zinc sulfate and zinc pyrophosphate are preferred.

The non-cyanide brass plating bath composition contains a metal polyphosphate. The metal polyphosphate is present in an amount from about 0.4 to about 1.2M, and preferably from about 0.6 to about 1.0M. The metal of the metal polyphosphate may be any metal capable of forming a polyphosphate salt, and as such the metal may be an alkali metal, an alkaline earth metal and/or a transition metal. The metal of the metal polyphosphate is preferably an alkali metal, an alkaline earth metal, copper and/or zinc. More preferably, the metal is an alkali metal. Mixtures of different metals can also be used. Examples of the metal include zinc, copper, tin, sodium, potassium, magnesium and calcium. Sodium, copper and zinc are most preferred. It is believed that the polyphosphate acts as a metal complexor capable of keeping the metals of the non-cyanide brass plating bath composition in solution via phosphoric complexes. Polyphosphate is a generic name for the compounds represented by the general formula:

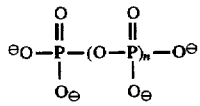

wherein n is a positive integer. It is desirable for the present invention to use the polyphosphate of the above formula wherein n is an integer of 1 to about 3. Specifically, the polyphosphate is pyrophosphate when n is 1, tripolyphosphate when n is 2, and tetrapolyphosphate when n is 3. Pyrophosphate is preferred. Examples of preferred metal polyphosphates include sodium pyrophosphate, copper pyrophosphate and zinc pyrophosphate.

The non-cyanide brass plating bath composition contains orthophosphate. Orthophosphate is present in an amount from about 0.2M to about 0.85M, and preferably from about 0.3M to about 0.5M. The orthophosphate is obtained by adding a suitable metal orthophosphate to the non-cyanide plating bath composition. The metal may be any metal discussed above as the metal of the metal polyphosphate. For instance, orthophosphate may be obtained from sodiumdihydrogenphosphate. Alternatively and/or additionally, orthophosphate may be obtained from phosphoric acid. Orthophosphate is believed to act as a buffer which contributes to the stability of the non-cyanide brass plating bath composition. It is believed that the orthophosphate can prevent pH elevation at the plating surface in the non-cyanide brass plating bath solution thus preventing copper from precipitating out of solution.

Since the amount of the four non-cyanide brass plating bath components changes during use of the bath, it is necessary to periodically or continuously monitor the bath so that the bath contains appropriate amounts of components throughout the plating procedure. Addition or deletion of components may be carried out as necessary.

The non-cyanide brass plating bath composition may optionally contain a tartrate salt or similar salt. The tartrate salt may be present in the composition in an amount of about 0.01 to about 0.1M, and preferably about 0.03 to about 0.08M. Examples of the tartrate salt include potassium and sodium tartrate tetrahydrate.

Optionally, the brass plating bath may also contain one or more substances which act as a catalyst, or other agents may be added to the brass plating bath in order to control the properties of the resultant brass layer. For example, brighteners may be added to the non-cyanide brass plating bath composition. Brighteners generally include organic sulfonates, sulfonamides and sulfonimides. Specific brighteners include benzene disulfonic acid, benzene trisulfonic acid, naphthalene disulfonic acid, naphthalene trisulfonic acid, benzene sulfonamides and sulfonimides. The amount of optional ingredients can be determined by one skilled in the art. Other optional compounds may include glues such as animal glue and fish glue, gelatine, saccharin, active sulfur compounds such as thiourea or other compounds having a bivalent sulfur atom.

The pH of the non-cyanide brass plating bath composition may be in the range of about 7 to about 10, preferably about 7.5 to about 9.5, and more preferably about 8 to about 9. The pH of the non-cyanide brass plating bath may be adjusted using an acid or a basic compound. For example, sodium hydroxide, sulfuric acid and/or phosphoric acid may be used to adjust the pH of the composition.

The temperature of the composition, during use, is from about 25° C. to about 60° C., preferably about 27° C., to about 50° C., and more preferably about 40° to about 47° C. The total metal content of the composition is less than about 20 g/l, and preferably less than about 15 g/l and more preferably less than about 11 g/l. The total metal content refers to the amount of both copper and zinc in the non-cyanide brass plating bath. This is in contrast to conventional cyanide brass plating baths which typically have a total metal content between 40 to 80 g/l.

The relatively low metal content keeps the plating efficiency well below 100%. The low metal content also enhances zinc deposition thereby providing a high quality brass layer. In one embodiment, the plating efficiency is kept below about 80% ; in a preferred embodiment, below about 75% ; and in a more preferred embodiment, below about 65%. Plating efficiency can be readily determined by one skilled in the art based upon the current used, the amount of metal plating, the time elapsed, the relative amount of copper versus zinc in the resultant brass layer and Faraday's constant.

The non-cyanide brass plating bath may be used in a method of making metallic foil having a brass layer. The non-cyanide brass plating bath may also be used in a method of applying a brass layer to metallic foil.

The method of making metallic foil having a brass layer initially includes providing a metallic foil. The metallic foil is preferably a conductive metallic foil or a conductive foil. The metallic foil may have one or more metal layers thereon. Preferably, the metallic foil is copper or copper alloy. The metallic foil used with this invention is preferably an electrically conductive foil with copper and the copper-based alloy foils being especially preferred. Other examples include aluminum, silver, platinum and gold. The copper foils may be made using at least one of two techniques. Wrought or rolled copper foil is produced by mechanically reducing the thickness of a copper or copper alloy strip or ingot by a process such as rolling. Electrodeposited foil is produced by electrolytically depositing copper on a rotating cathode drum and then peeling the deposited strip from the cathode. Electrodeposited copper foils are especially preferred.

The metallic foils typically have nominal thicknesses ranging from about 0.0002 inch to about 0.02 inch. Copper foil thickness is sometimes expressed in terms of weight and typically the foils of the present invention have weights or thicknesses ranging from about ⅛ to about 14 oz/ft². Especially useful copper foils are those having weights ½, about 1 or about 2 oz/ft².

Electrodeposited metallic foils have a smooth or shiny (drum) side and a rough or matte (metal deposit growth front) side. A brass layer can be adhered to either side of the foil, and in some instances it is adhered to both sides of the foil.

The side or sides of the metallic foil (electrodeposited or wrought) to which the brass layer is adhered can be a "standard-profile surface," "low-profile surface" or "very-low-profile surface." Especially preferred embodiments involve the use of foils with low-profile surfaces and very low-profile surfaces. The term "standard-profile surface" is used herein to refer to a foil surface having an $R_{tm}$ of about 10 microns or less. The term "low-profile surface" refers to a foil surface having an $R_{tm}$ of about 7 microns or less. The term "very-low-profile surface" refers to a foil surface having an $R_{tm}$ of about 4 microns or less. $R_{tm}$ is the mean of the maximum peak-to-valley vertical measurement from each of five consecutive sampling measurements, and can be measured using a Surftronic 3 profilometer marketed by Rank Taylor Hobson, Ltd., Leicester, England.

The metallic foils of the present invention may be characterized by the absence of any added surface roughening treatment on the base surface of the side or sides to which the brass layer is adhered. The term "base surface" of a side of foil refers to a raw foil surface which has not been subjected to any subsequent treatments of the type discussed below for refining or enhancing foil properties and/or increasing surface roughness.

The term "added surface roughening" refers to any treatment performed on the base surface of the foil that increases the roughness of the surface of the foil.

In one embodiment, mechanical roughness imparted to wrought metallic foil during rolling or by subsequent abrasion which increases roughness beyond that of a standard profile surface is considered to be an added surface roughening treatment. In one embodiment, roughness imparted to an electrodeposited copper foil during electrodeposition which increases roughness beyond that of a standard profile surface is considered to be an added surface roughening. In one embodiment, any roughness imparted to the base surface of a metallic foil that increases the roughness of said foil beyond that of a standard profile surface is considered to be an added surface roughening treatment. In one embodiment, any roughness imparted to the base surface of a metallic foil that increases the roughness of said foil beyond that of a low-profile surface is considered to be an added surface roughening treatment. In one embodiment, any roughness imparted to the base surface of a metallic foil that increases the roughness of said foil beyond that of a very low-profile surface is considered to be an added surface roughening treatment.

In one embodiment, the foils of the present invention are characterized by the absence of a metallic layer consisting of zinc or a metallic layer consisting of chromium applied to the base surface of the metallic foil underlying the brass layer (note that this feature does not exclude the use of metallic layers comprised of mixtures of both zinc and chromium that are applied to the base surface).

In one embodiment, a metallic foil is subjected to a precleaning treatment. A precleaning treatment involves soaking the metallic foil in a hot alkaline bath followed by rinsing and soaking in an acidic bath followed by rinsing.

In one embodiment, the base surface of the side or sides of the metallic foil to which the brass layer is adhered is untreated prior to the application of the brass layer to the foil. The term "untreated" is used herein to refer to the base surface of a foil that has not undergone subsequent treatment for the purpose of refining or enhancing the foil properties and/or increasing surface roughness. In one embodiment, the untreated foils have a naturally occurring, non-dendritic or non-nodular layer of copper oxide adhered to the base surface thereof.

In one embodiment, the base surface of the side or sides of the foil to which the brass layer is adhered is treated, prior to the application of the brass layer, with one or more surface treatment layers for the purpose of refining or enhancing the foil properties. Any side of the foil which does not have a brass layer applied to it can, optionally, also have one or more of such treatment layers applied to it. These surface treatments are known in the art.

The surface treatments also include the application of a metallic layer wherein the metal is tin, chromium-zinc mixture, nickel, molybdenum, aluminum, or a mixture of two or more thereof. Metallic layers of this type are sometimes referred to as stabilization layers. These stabilization layers can be applied to the base surface of the foil, or they can be applied to a previously applied barrier layer. These stabilization layers preferably have thicknesses in the range of about 0.005 to about 0.05 micron, more preferably about 0.01 to about 0.02 micron.

The surface treatments include the application of a metallic layer to the base surface of the foil wherein the metal is selected from the group consisting of indium, tin, nickel, cobalt, brass, bronze, and mixtures of two or more thereof. Metallic layers of this type are sometimes referred to as barrier layers. These barrier layers preferably have thicknesses in the range of about 0.01 to about 1 micron, more preferably about 0.05 to about 0.1 micron.

In one embodiment, one or both sides of the foil are first treated with at least one barrier layer, then at least one of the treated sides is treated with at least one stabilization layer prior to the application of the brass layer. The brass layer is then applied over the stabilization layer. In this embodiment the stabilization layer can be a layer of zinc or a layer of chromium in addition to those discussed above.

The metallic foil is contacted with the brass plating bath as the cathode in an electroplating system. This may be accomplished stepwise via plates or in a continuous fashion via a rotating mandrel. As a general guide the contact time may range from about 5 to about 20 seconds, and preferably from about 8 to about 15 seconds.

A current is applied to the non-cyanide brass plating bath in contact with the metal foil. The current density is at least about 50 ASF and more preferably at least about 60 ASF. The current density is at most about 100 ASF and more preferably at most about 80 ASF.

A metallic foil having a brass layer is subsequently recovered.

In a preferred embodiment, the brass plating bath is used in a method of making a copper foil having a brass barrier layer. These resultant brass barrier layers preferably have thicknesses in the range of about 0.01 to about 1 micron, more preferably about 0.05 to about 0.1 micron.

Controlling certain process parameters permits one to manipulate the plating efficiency, thickness of deposit, degree of luster and the like. For example, bath temperature, current density, plating time, etc. may be adjusted in order to effect the specific characteristics desired for the resultant brass layer.

The resultant brass layer is a smooth and continuous layer. In the brass layer, the distribution of zinc is substantially uniform across the plated surface. The chemical composition of the resultant brass layer generally falls in the range of about 70% to about 85% copper and more preferably about 75% to about 80% copper, the balance being zinc. The relative amounts of copper and/or zinc can be controlled by changing the amount of the copper containing compound and/or zinc containing compound which is added to the non-cyanide brass plating bath.

Although the major components of the resultant brass layer are copper and zinc, other metals may be present in small or trace amounts. Small or trace amounts include those less than about 5%, preferably less than about 3%, and more preferably less than about 2%.

The metallic foils having a brass layer can be bonded to dielectric substrates to provide dimensional and structural stability thereto. The brass layer of the invention enhances the bond or peel strength between the metallic foil and the dielectric substrate. An advantage of the inventive metallic foils is that these foils avoid added surface roughening, yet exhibit effective bond or peel strength with dielectric substrates. These foils can have a standard profile surface, low-profile surface and even a very low-profile surface, and yet provide the desired peel strength. With the inventive foils, either the matte side or shiny side can be effectively bonded to a dielectric substrate.

After deposition of the brass layer is completed, the metallic foil having the brass layer thereon may be rinsed and subsequently ready for lamination. However, it may be desirable to treat the metallic foil having a brass layer thereon prior to lamination. For example, the metallic foil having a brass layer thereon may be treated so as to add an adhesion promoting layer thereon, or with a corrosion prohibiting agent, or it may be passivated using passivation techniques. Passivation may involve chromate dipping or cathodic electrolysis of a chromate solution.

Prior to laminating the metallic foils to a dielectric substrate, the metallic foils may also contain one or more adhesion promoting layers adapted for enhancing adhesion between the foil and a polymeric resin substrate. The adhesion-promoting layer may comprise at least one silane coupling agent. In one embodiment the adhesion promoting layer is characterized by the absence of chromium intermixed therewith. The adhesion promoting layer may be made by applying one or more silane coupling agents to at least one side or surface of the foil.

Useful dielectric substrates may be prepared by impregnating woven glass reinforcement materials with partially cured resins, usually epoxy resins (e.g., difunctional, tetrafunctional and multifunctional epoxies). Other useful resins include amino type resins produced from the reaction of formaldehyde and urea or formaldehyde and melamine, polyesters, phenolics, silicones, polyamides, polyimides, diallyl phthlates, phenylsilanes, polybenizimidazoles, diphenyloxides, polytetrafluoroethylenes, cyanate esters, and the like. These dielectric substrates are sometimes referred to as prepregs.

In preparing the laminates, it is useful for both the prepreg material and the metallic foil to be provided in the form of long webs of material rolled up in rolls. In one embodiment, these long webs of foil and prepreg are laminated using a continuous process. In this process, a continuous web of the inventive foil with the adhesion promoting layer adhered thereto is brought into contact with a continuous web of prepreg material under laminating conditions to form a laminate structure. This laminate structure is then cut into rectangular sheets and the rectangular sheets are then laid-up or assembled in stacks of assemblages.

In one embodiment, the long webs of foil and prepreg material are first cut into rectangular sheets and then subjected to lamination. In this process rectangular sheets of the inventive metallic foil have a brass layer adhered thereto and rectangular sheets of the prepreg material are then laid-up or assembled in stacks of assemblages.

Each assemblage may comprise a prepreg sheet with a sheet of foil on either side thereof, and in each instance, the side (or one of the sides) of the metallic foil sheet with the brass layer adhered thereto is positioned adjacent the prepreg. The assemblage may be subjected to conventional laminating temperatures and pressures between the plates of laminating presses to prepare laminates comprising sandwiches of a sheet of prepreg between sheets of metallic foil.

The prepregs may consist of a woven glass reinforcement fabric impregnated with a partially cured two-stage resin. By application of heat and pressure, the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 250 to about 750 psi, temperatures in the range of from about 175° C. to 235° C. and a laminating cycle of from about 40 minutes to about 2 hours. The finished laminate may then be utilized to prepare printed circuit boards (PCB).

In one embodiment, the laminate is subjected to a subtractive copper etching process to form electrically conductive lines or an electrically conductive pattern as part of a process for making a multilayered circuit board. A second brass layer is then applied over the etched pattern using the techniques discussed above and then a second prepreg is adhered to the etched pattern; the second brass layer being positioned between and adhered to both the etched pattern and the second prepreg. The techniques for making multilayered circuit boards are well known in the art. Similarly, subtractive etching processes are well known, an example of which is disclosed in U.S. Pat. No. 5,017,271, which is incorporated herein by reference.

A number of manufacturing methods are available for preparing PCBs from laminates. Additionally, there is a myriad of possible end use applications including radios, televisions, computers, etc., for the PCB's. These methods and end uses are known in the art.

Metal foils having a brass layer thereon obtained in accordance with the present invention may be used as conducting elements in printed circuits and particularly in multilayer laminates. No staining is observed after lamination.

The metal foil having a brass layer made according to the present invention may be used in the electronic and printed circuit board industry. For example, the metal foil having a brass layer may be used to manufacture laminates, which in turn, may be used in various electronic components such as computers, televisions, radios, video cassette recorders and the like.

While not intending to be so limiting, the following examples illustrate various and novel aspects of the present invention. Unless otherwise indicated, in the following examples as well as throughout the specification and claims, all parts and percentages are by weight, all temperatures are in degrees centigrade, and all pressures are atmospheric.

EXAMPLE 1

A non-cyanide brass electrodeposition bath is prepared. The bath contains 0.1 5M copper from copper sulfate, 0.09M zinc from zinc sulfate, 1M sodium pyrophosphate, and 0.36M orthophosphate from sodiumdihydrogenphosphate. The temperature of the bath is about 60° C. The current density employed is about 60 to about 80 ASF and the plating time is about 10 seconds. A copper foil having a brass layer thereon travelling at about 100 to about 150 ft/min is recovered from the bath and rinsed with deionized water. The copper foil is characterized in that it possesses a bright yellow brass deposit thereon.

While the invention has been explained in relation to its preferred embodiments, it is to be understood that various method thereof will become apparent to those skilled in the art upon reading this specification. Therefore, it is to be understood that the invention disclosed herein is intended to cover such modifications falling within the scope of the appended claims.

What is claimed is:

1. A non-cyanide brass electroplating bath composition, comprising:

about 0.03M to about 0.15M copper, about 0.03M to about 0.09M zinc, about 0.4M to about 1.2M sodium polyphosphate, and about 0.2M to about 0.85M orthophosphate, with the proviso that the composition does not contain cyanide, wherein the composition has a metal content of copper and zinc below about 15 g/l.

2. The composition of claim 1, wherein the polyphosphate of the sodium metal polyphosphate is pyrophosphate.

3. The composition of claim 1, wherein the copper is obtained from copper sulfate or a hydrate thereof.

4. The composition of claim 1, wherein the zinc is obtained from zinc sulfate or a hydrate thereof.

5. A method of making metallic foil having a brass layer, comprising:

providing a metallic foil;

contacting the metallic foil with a non-cyanide brass electroplating bath comprising copper, zinc, sodium polyphosphate, and orthophosphate, with the proviso that the brass plating bath does not contain cyanide, wherein the bath has a metal content of copper and zinc below 20 g/l;

applying a current to the brass electroplating bath, wherein the current has a current density in the range from about 60 to about 80 ASF; and recovering the metallic foil having a brass layer.

6. The method of claim 5, wherein the non-cyanide brass electroplating bath comprises:

about 0.03M to about 0.15M copper, about 0.03M to about 0.09M zinc, about 0.4M to about 1.2M sodium polyphosphate, and about 0.2M to about 0.85M orthophosphate.

7. The method of claim 5, wherein the polyphosphate of the sodium polyphosphate is pyrophosphate.

8. The method of claim 5, wherein the bath has a metal content of copper and zinc below about 15 g/l.

9. The method of claim 5, wherein the bath has a temperature in the range from about 40° C. to about 60° C.

10. The method of claim 5, wherein the bath has a pH in the range from about 7.5 to about 9.

11. The method of claim 5, wherein the metallic foil contains a layer of copper foil.

12. The method of using a non-cyanide brass electroplating bath, comprising:

contacting a metallic foil with the non-cyanide brass electroplating bath, wherein the non-cyanide brass electroplating bath comprises copper, zinc, sodium polyphoshate, and orthophosphate under a current density from about 60 to about 80 ASF, with the proviso that the brass plating bath does not contain cyanide, wherein the bath has a metal content of copper and zinc below 20 g/l.

13. The method of claim 12, wherein the non-cyanide brass electroplating bath comprises:

about 0.03M to about 0.15M copper, about 0.03M to about 0.09M zinc, about 0.4M to about 1.2M sodium polyphosphate, and about 0.2M to about 0.85M orthophosphate.

14. A non-cyanide brass electroplating bath composition, comprising:

about 0.03M to about 0.15M copper, about 0.03M to about 0.09M zinc, about 0.4M to about 1.2M sodium polyphosphate, and about 0.2M to about 0.85M orthophosphate, with the proviso that the composition does not contain cyanide, wherein the composition has a metal content of copper and zinc below 20 g/l.

* * * * *